United States Patent
Li

(10) Patent No.: US 10,650,885 B2
(45) Date of Patent: May 12, 2020

(54) EXTENDING FLASH STORAGE LIFESPAN AND DATA QUALITY WITH DATA RETENTION PROTECTION

(71) Applicant: Alibaba Group Holding Limited, George Town (KY)

(72) Inventor: Shu Li, Bothell, WA (US)

(73) Assignee: Alibaba Group Holding Limited (KY)

( * ) Notice: Subject to any disclaimer, the term of this patent is extended or adjusted under 35 U.S.C. 154(b) by 300 days.

(21) Appl. No.: 15/452,263

(22) Filed: Mar. 7, 2017

(65) Prior Publication Data

US 2018/0260134 A1 Sep. 13, 2018

(51) Int. Cl.
| | |
|---|---|
| G06F 12/00 | (2006.01) |
| G11C 11/56 | (2006.01) |
| G11C 16/34 | (2006.01) |
| G11C 16/04 | (2006.01) |
| G11C 16/32 | (2006.01) |

(52) U.S. Cl.
CPC ...... G11C 11/5628 (2013.01); G11C 11/5642 (2013.01); G11C 16/0483 (2013.01); G11C 16/32 (2013.01); G11C 16/349 (2013.01); G11C 16/3418 (2013.01); G11C 16/3431 (2013.01); G11C 16/3495 (2013.01)

(58) Field of Classification Search
CPC . G11C 11/5628; G11C 16/3431; G11C 16/32; G11C 16/349; G11C 11/5642; G11C 16/3495; G11C 16/0483; G11C 16/3418
USPC ........................................................ 711/103
See application file for complete search history.

(56) References Cited

U.S. PATENT DOCUMENTS

| | | | |
|---|---|---|---|
| 2010/0082890 A1 | 4/2010 | Heo | |
| 2010/0325349 A1* | 12/2010 | Otsuka | G06F 12/0246 711/103 |
| 2011/0055623 A1* | 3/2011 | Kim | G06F 11/141 714/710 |
| 2011/0066808 A1 | 3/2011 | Flynn | |
| 2012/0054414 A1 | 3/2012 | Tsai | |
| 2012/0096217 A1 | 4/2012 | Son | |
| 2015/0149698 A1* | 5/2015 | Cai | G11C 11/5628 711/103 |
| 2016/0350021 A1* | 12/2016 | Matsushita | G06F 12/0873 |
| 2017/0293446 A1* | 10/2017 | Lo | G11C 16/10 |
| 2017/0371559 A1* | 12/2017 | Higgins | G06F 3/0611 |

FOREIGN PATENT DOCUMENTS

WO   WO 2012012261   *  1/2012

* cited by examiner

*Primary Examiner* — Mardochee Chery
(74) *Attorney, Agent, or Firm* — Van Pelt, Yi & James LLP

(57) ABSTRACT

One technique for extending flash storage lifespan and data quality with data retention protection includes: determining whether page data included in a page in a solid state drive (SSD) has been copied to another storage; in the event that the page data has not been copied to the other storage: determining whether the page data is to be refreshed; and in the event that the page data is determined to be refreshed, refreshing at least the page data. Another technique includes determining whether a number of times a page has been read exceeds a read threshold, or an amount of time since the page was written exceeds a retention threshold.

30 Claims, 10 Drawing Sheets

US 10,650,885 B2

EXTENDING FLASH STORAGE LIFESPAN AND DATA QUALITY WITH DATA RETENTION PROTECTION

BACKGROUND OF THE INVENTION

Solid State Drives (SSDs) are often implemented using Not-AND (NAND) flashes. The typical NAND flash holds charge in its floating gate. Depending on the amount of charge stored, a threshold voltage used to switch the NAND flash changes. Different threshold voltages correspond to different charge levels and therefore denote different values of stored data bits. As a NAND flash cell is programmed or erased, charges are injected into or expelled from the floating gate, forming temporary tunnels through the dielectric insulators that surround the floating gate. Over time, as the cell undergoes more programming or erasing operations, the dielectrics become worn out, and the ability of the floating gate to hold charges is weakened. The worn-out dielectrics can lead to program/erase errors as well as read failures due to high error rate after data retention. The program/erase errors can be detected during the programming or erasing operations and can usually be immediately fixed by masking out the defective units. The read failures, however, are more difficult to handle because they typically manifest after a certain data retention period. Manufacturers often deal with the read failures by over-designing the NAND flash cells (e.g., by changing the geometry of the dielectric insulators), which tends to increase the cost of the SSD devices.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Extending the life span and data quality of solid state drives is disclosed. Through the use of workload adaptation and positive write amplification, the data quality and effective lifespan of the devices are improved.

Figure 1A:
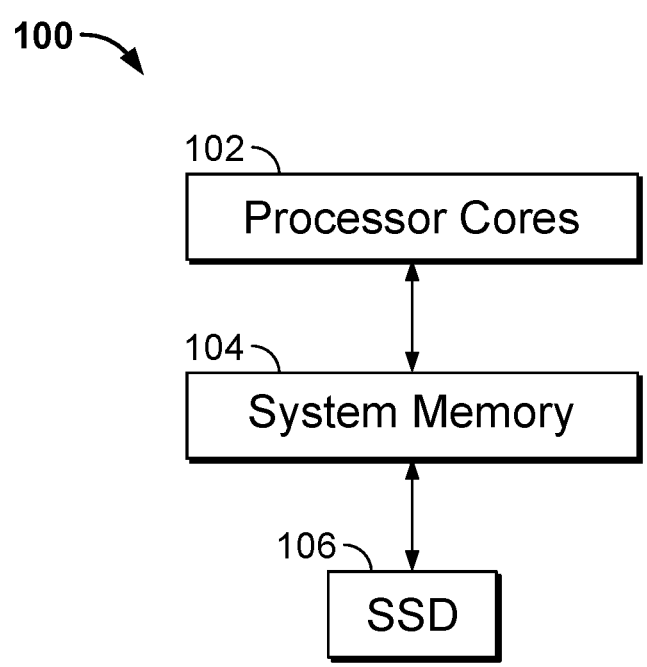
FIG. 1A is a block diagram illustrating an embodiment of a storage system.

FIG. 1A is a block diagram illustrating an embodiment of a storage system. System 100 includes a host portion which includes one or more processors 102 and one or more system memories (also referred to as host memories) 104 configured to provide the processors with instructions. The host portion is coupled to a solid state drive portion using appropriate interconnects such as Peripheral Component Interconnect Express (PCIe) lanes, Small Computer System Interface (SCSI) connections, etc. Although a single SSD 106 is shown for purposes of illustration, multiple SSDs (including a single type or multiple types of SSDs) can be included in various embodiments. For example, one or more PCIe SSDs and/or one or more serial attached SCSI/serial AT attachment (SAS/SATA) SSDs can be included in the SSD portion. Many other components such as input/output components, networking components, etc., can be included in system 100 but are omitted from the figure.

Figure 1B:
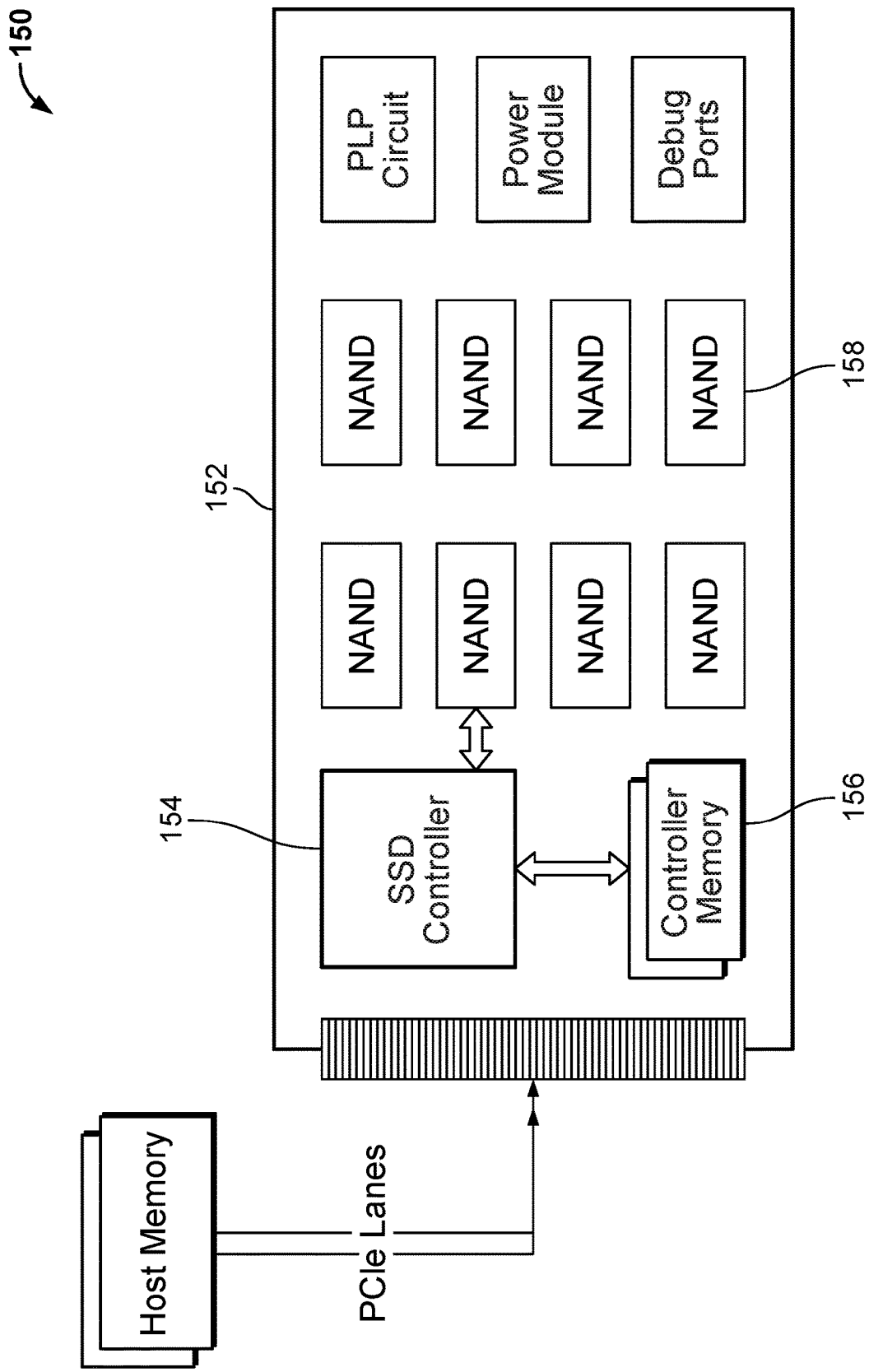
FIG. 1B is a block diagram illustrating another embodiment of a storage system.

FIG. 1B is a block diagram illustrating another embodiment of a storage system. In system 150, details of an SSD 152 are shown. An SSD controller 154 is coupled to controller memory 156, and to NAND flash elements 158. SSD controller 154 can be implemented using one or more microprocessors, standard processors, or the like, to execute code that monitors and controls the operations of the NAND flash elements. The NAND flash elements can include single-level cell (SLC) flash, multi-level cell (MLC) flash, etc.

Figure 1C:
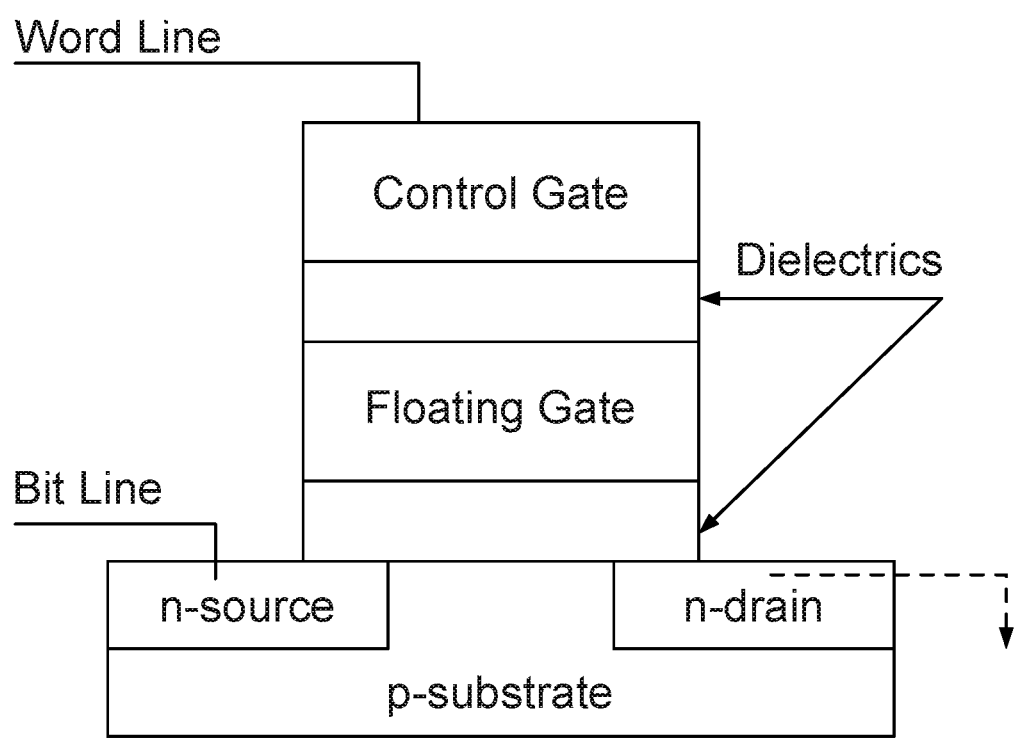
FIG. 1C is a block diagram illustrating an embodiment of a NAND flash.

FIG. 1C is a block diagram illustrating an embodiment of a NAND flash. When the dielectric layers providing isolation become worn out with repeated programming and erasing of the cell, the capability of the floating cell to hold charge becomes weak. After a period of data retention, the charges escape and the threshold voltage drifts, causing increased error rate and read failure.

The data retention and endurance of a specific model of NAND flash are usually set within individual ranges by the manufacturer. The operating conditions for these parameters can be defined by standard tests such as those specified by the JEDEC Solid State Technology Association. A common parameter that denotes the endurance of an SSD is the drive write per day (DWPD), which is calculated as:

$$DWPD = \frac{Np}{e} \frac{1+OP}{365 \cdot Nyear \cdot WA}$$

where $$\frac{Np}{e}$$

denotes the number of tolerable P/E cycles and is typically specified by the NAND manufacturer for the specific model of NAND flash; OP denotes the amount of overprovision (e.g., an SSD has 500 GB of storage nominally, but the hardware is overprovisioned to include 530 GB of storage cells to guard against defects, etc.); Nyear denotes the expected usage of the SSD in a year; and WA denotes the write amplification factor, and is dependent on the actual workload.

Figure 2:
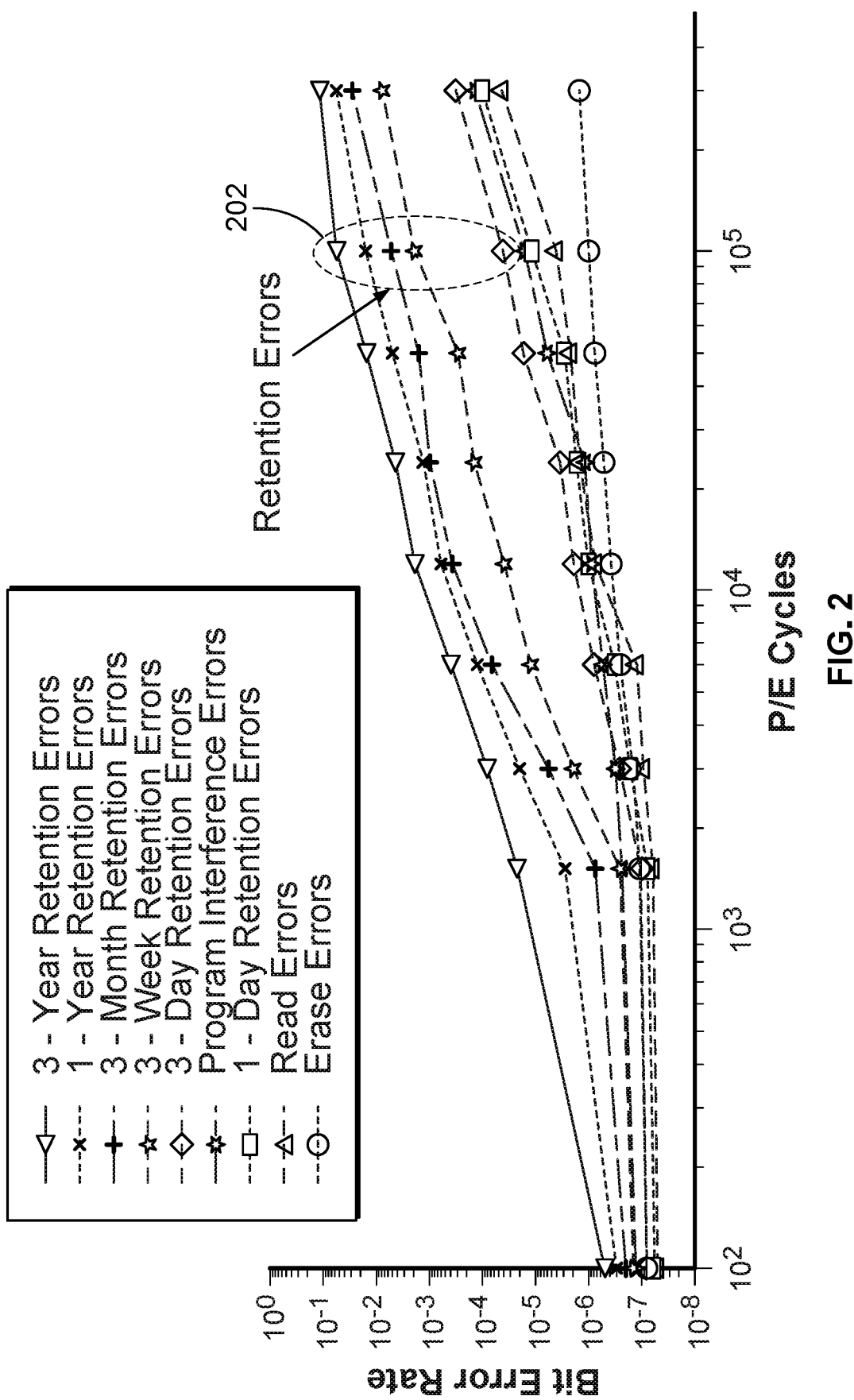
FIG. 2 is a diagram illustrating data retention trend over time passed.

Empirical studies and statistical analyses show that the longer a NAND flash page has been programmed, the higher the page's raw bit error rate. This phenomenon is referred to as the data retention problem. FIG. 2 is a diagram illustrating data retention trend over time passed. As shown in region 202, given the same number of P/E cycles, the longer the data is kept in the NAND flash, the higher the rate of retention errors (measured in bit error rate of read data). While data retention causes the error rate to increase, other noise sources such as the read disturb, cell-to-cell interference, etc., also have cumulative effects over time. Reprogramming the data (e.g., copying data to a new location and erasing old data) can generate new data and reset the noise conditions and achieve a tolerable signal to noise ratio. Thus, even though repeatedly erasing of the NAND flash can lead to damages to the dielectrics of the floating gate, a moderate number of reprogramming can bring about the benefit of resetting the noise conditions to their initial, un-accumulated states.

SSD vendors typically evaluate the endurance with conservative margins in all aspects, including the P/E cycle for the NAND flash, the fault tolerance capacity of the controller, and the system level evaluation. The conservative margins lead to high reliability as well as waste of SSD resources. For example, the data retention of some enterprise-scaled SSD requires keeping the data for 90 days after the power is shut off, which in practice is hardly necessary.

Applications with different workloads can lead to different levels of wearing on the flash of the SSD. For example, data associated with write-intensive (WI) applications such as financial transaction applications, log applications, etc. that write a high volume of data into the SSD and make frequent modifications to the data. In contrast, write once read multiple (WORM) applications such as database applications, media archiving applications, webpage publishing, etc., write data into the SSD once and read out the data frequently. How frequently data should be copied to a new location is therefore different for these different types of data. Thus, in some embodiments, different data refresh processes are employed for different types of applications.

Figure 3:
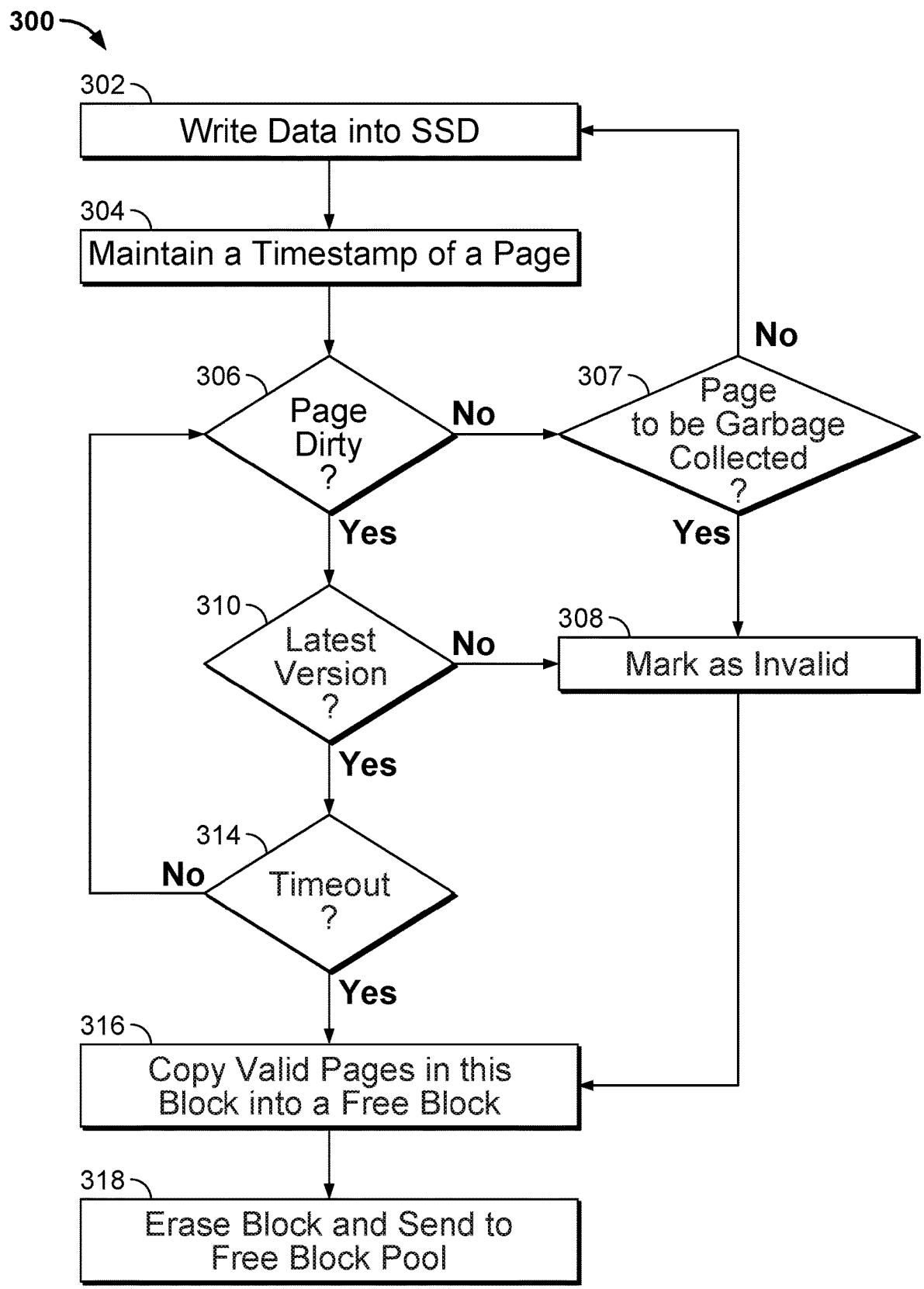
FIG. 3 is a flowchart illustrating an embodiment of a process for enhancing SSD utilization and providing data retention protection for a write-intensive application.
Figure 5:
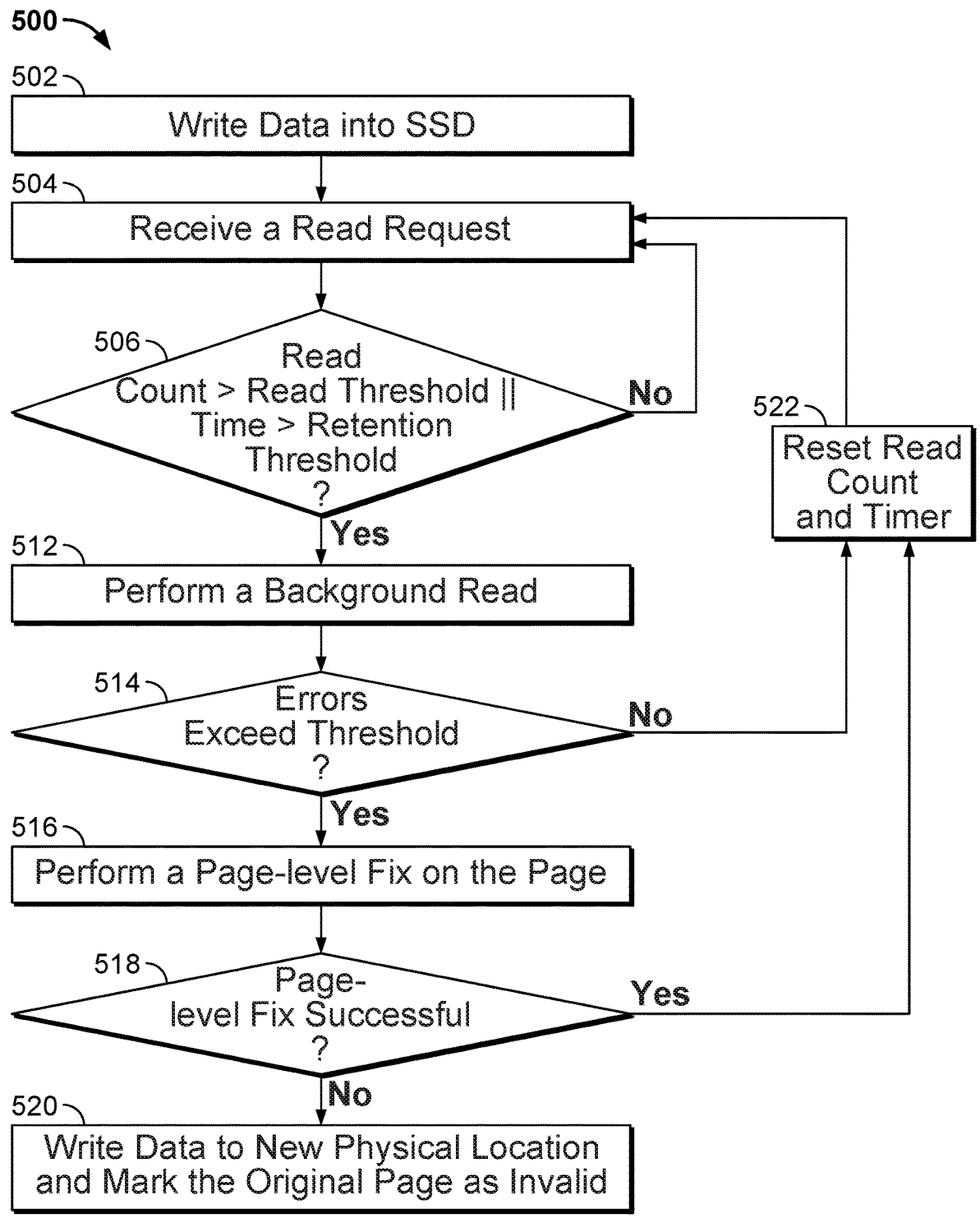
FIG. 5 is a flowchart illustrating an embodiment of a process for enhancing SSD utilization and providing data retention protection for a WORM application.

In some embodiments, applications are classified as write-intensive applications or WORM applications. The classification can be made manually by a user such as an administrator based on experience, or automatically by the host based on monitoring applications' behavior and analyzing the number of reads/writes. The configurations can be stored in a configuration file, a table, a database, or the like, and read at system initialization time. The driver (e.g., a program implemented in a microprocessor, a microcontroller, or any other appropriate processor) for the SSD intercepts requests from the host and determines whether the request came from a write-intensive application or a WORM application based on the configurations. Process 300 of FIG. 3 is invoked if the application is a write-intensive application, and process 500 of FIG. 5 is invoked if the application is a WORM application. In some embodiments, different application programming interfaces (APIs) are provided for invoking process 300 or 500, and the application developer selects the appropriate API to use for invoking an appropriate process.

FIG. 3 is a flowchart illustrating an embodiment of a process for enhancing SSD utilization and selectively providing data retention protection for a write-intensive application. Process 300 can be performed by an SSD such as 106, and can run as a background process. The controller provides data retention protection by refreshing (rewriting) valid data from one flash location to another.

In write-intensive applications, data is written into the SSD as cache data and later copied to other storage devices (e.g., a RAID, a disk drive, a tape backup, or any other appropriate storage other than the SSD itself). When the data is copied to another storage device, it does not need to remain in the SSD. However, frequently erasing data from the SSD and trim NAND pages will affect the performance of the SSD. Thus, it is preferable for the data to remain in the NAND flash even after it has been copied to another storage, and for such data to be cleaned up by the internal garbage collection process by the SSD. Such data is also potentially subject to regular data retention protection by the SSD. If, however, the SSD were to perform regular data retention protection on such data by moving data periodically and indiscriminately, the movement could cause write amplification and shorten the lifespan of the device. Process 300 avoids unnecessary write amplification due to data retention protection by marking data to indicate whether the data requires data retention protection.

At 302, data is written into the SSD. For example, the I/O portion of the operating system of the host can group data from various sources and make requests to the SSD to write the data into the NAND flashes on the SSD. In this example, data is written into the NAND flashes of the SSD in units of pages, in append-only mode, such that when data corresponding to a page is to be updated, the updated data is written at the end of the current write pointer location, and the old data is invalidated rather than replaced. This way of writing is also referred to as writing in a log-structured manner with burden.

At 304, timestamps are maintained for pages in data blocks to keep track of when individual pages are written. A data block comprises multiple physical pages (e.g., a 4 MB data block can be formed by 4 KB pages). In this example, the controller creates a timestamp associated with a page when the page is written, and stores the timestamp as metadata (e.g., header information) in the page. Further, each page has a corresponding "dirty" flag used to indicate whether the data of the page has been copied to another storage. In this example, a "dirty" flag set to true (1) indicates that the page is dirty, or equivalently, the page data has not yet been copied to another storage. A "dirty" flag set to false (0) indicates that the page data has been copied to another storage. As will be explained in more detail below, a page that is not dirty (not been copied into another storage) does not require data retention protection and can be ignored for data retention protection purposes, and a page that is dirty may require data retention protection and needs to be further examined. Further, each page has a corresponding version flag used to indicate whether the page data corresponds to the latest version of the data content. In this example, a single bit is used, where a value of true (1) indicates that the page is the latest version, and a value of false (0) indicates that the page is not the latest version (e.g., the data corresponding to the page has been updated and the updated data is stored elsewhere). Initially, all the pages in the written block are marked as the latest version. As will be shown in more detail below, the page data is no longer the latest version if the content of the page has been copied elsewhere, or if the content of the page is to be modified (in which case a new page with the modified content is created).

Figure 4A:
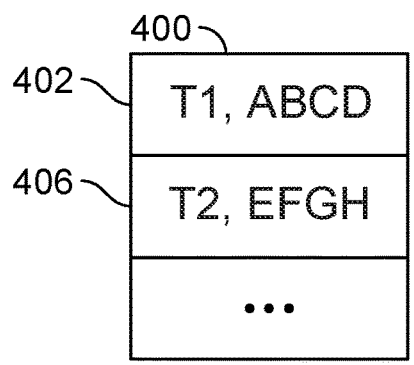
FIGS. 4A-4C are diagrams illustrating an example of data being managed for a write-intensive application.

Referring to FIG. 4A for an example. In accordance with 302 and 304 of process 300, in data block 400, pages 402 and 406 are written with page data of ABCD and EFGH, and timestamps T1 and T2, respectively. At this point, the statuses of all pages (e.g., pages 402, 406, etc.) in the block indicate that the pages are dirty (not yet copied to other storage), and marked as being the latest version.

Returning to FIG. 3, at 306, it is determined whether a page is dirty. The determination can be made in response to the page being requested by the host system or by the SSD, in response to a data retention protection service that examines the pages periodically or at predetermined times, or the like. In this example, the dirty flag of the page is checked to make the determination.

A page that is marked as not dirty (e.g., "dirty" flag set to 0) has been copied to another storage, and can be erased/reclaimed. The page, therefore, can be ignored for data retention protection purposes and the page data will not be refreshed. Such a page can be erased/reclaimed through the SSD's garbage collection process. At 307, it is determined whether the page needs to be garbage collected. If the page does not need to be garbage collected, the process returns to the beginning. If the page needs to be garbage collected, the page is marked as invalid at 308 and will be garbage collected in 316 and 318.

A page that is marked as dirty (e.g., "dirty" flag set to 1) has not been persisted to another storage. It may need data retention protection if it is the latest version. A determination of whether the data in the page (page data) should be refreshed is made, and the page data is refreshed (e.g., copied to another location in the SSD) as appropriate. As shown in this example, if, at 306, it is determined that the page is marked as dirty, the page is subject to further evaluation to determine whether it is the latest version. A page marked as dirty may not need to be updated when, for example, the data is modified and becomes obsolete, or when the SSD performs an internal refresh to read data in the data block and copies the data to another location. Thus, at 310, the version flag of the page is checked to determine whether the content of the page is the latest version. If the content of the page is not the latest version (e.g., the data already has been refreshed by the controller or corresponding content has been modified), then the page is deemed to be obsolete, and the process proceeds to 308, where the page is marked as invalid and will be garbage collected. If, however, the page is the latest version, at 314, the timestamp is checked to determine whether the time since the data was written has exceeded a preset threshold (or equivalently, a refresh timeout has been reached). If the refresh timeout has not been reached, nothing needs to be done for the page at this point, and the process returns to 306 to wait for and process the next request. If, however, a timeout has occurred, then the page is still valid and the data block needs to be refreshed (this is because the SSD performs refresh on a per-block basis in this example).

To refresh the data block, at 316, valid pages in this block are copied into a free block, where a new timestamp is created and new status indicators (e.g., whether page is valid, whether page is the latest version) are initialized. At 318, the data block is erased and put into a pool of free blocks so it can be reused. The flash translation layer (FTL) will maintain the mapping of the rewritten pages to their logical locations in the host. Since data needs to be copied, the refresh process is a form of write amplification.

Process 300 reduces the possibility of data loss after the refresh timeout. In this example, the refresh timeout is an empirically determined value, chosen based at least in part on the DWPD. The timeout is chosen empirically such that the Np/e value is not exceeded. For example, for a refresh timeout of 3 days, an SSD with a DWPD of 3 can be used.

Figure 4B:
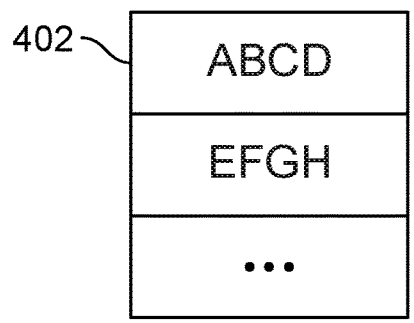
Figure 4C:
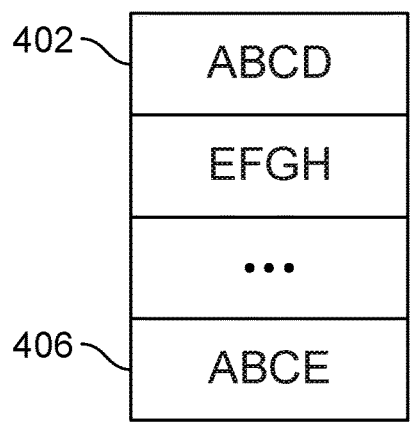

FIGS. 4A-4C are diagrams illustrating an example of data being managed for a write-intensive application. Process 300 is explained in connection with FIGS. 4A-4C. In FIG. 4A, pages 402 and 406 store the data content of "ABCD" and "EFGH", respectively. Initially, neither page is stored to another storage, and both pages are marked as dirty. When 306 of process 300 is invoked, the dirty pages are checked to determine whether they are the latest versions. In the case of FIG. 4A, their version flags will indicate that they are the latest versions. Their timestamps are checked to determine whether the refresh timeout has been reached, and in the event that the refresh timeout has been reached, the corresponding data blocks are refreshed (copied). If the timeout has not been reached, the process will continue to monitor the pages but will not immediately refresh the data blocks.

Suppose, as shown in FIG. 4B, the content of page 402 is copied to another storage. In this case, the dirty flag associated with the page is set to 0 (not dirty). When 306 of process 300 is invoked, page 402 is deemed not to require data retention protection because it has been copied to another storage. Garbage collection will be performed on the page as appropriate.

Suppose, as shown in FIG. 4C, page 402 has not been copied to another storage (thus the dirty flag remains to be 1). The host data corresponding to page 402 also has changed (e.g., the corresponding host memory has changed its content from "ABCD" to "ABCE"). The SSD effectuates the change by writing "ABCE" to a new physical page 406 in the SSD. Page 402 is no longer the latest version and its version flag is set to 0. As a result of the change, when 306 of process 300 is invoked, page 402 is found to be "dirty". Subsequently, based on the status of the version flag, page 402 will be found to not to be the latest version, and therefore will be ignored for retention protection purposes and will be garbage collected.

FIG. 5 is a flowchart illustrating an embodiment of a process for enhancing SSD utilization and providing data retention protection for a WORM application. In a WORM application, after data is written, it is kept in the SSD for as long as possible to minimize the number of P/E cycles.

At 502, the data is written to the SSD at the request of the host. For example, a database management tool such as RocksDB can issue commands to write data to the SSD. The pages are timestamped when they are written. Further, each page has a read counter that is initialized to zero and incremented each time the page is read. In some embodiments, the timestamp and read counter are stored as metadata (e.g., header data) in the corresponding page.

At 504, a read request is received. In this example, the read request is a request to read a specific page.

At 506, it is determined whether the value of the read counter of the page exceeds a read threshold, or if the time since the data block was written has exceeded a retention threshold. The thresholds can be chosen based on empirical measurements. If neither condition is true, the page does not need to be refreshed at this point, and the process returns to 504 to wait for another read request. If, however, the value of the read counter exceeds the read threshold, the time since the data block was written has exceeded the retention threshold, or both, then a background read is performed by the SSD at 512. The background read operation obtains raw data of the page and performs error correcting decoding in a manner that is similar to a standard read operation. The background read operation does not necessarily return a read result to the host.

The error correcting decoding portion of the background read will generate an indication of the amount of error in the page. For example, the number of bits being corrected, the bit error rate, etc., can be used as the indication. The indication is compared with a preset error threshold, and it is determined whether the errors in the page exceed the error threshold at 514. If the error criterion is not exceeded, the page is considered to be safe from data retention problems. Accordingly, the read counter and the timer are reset for the page at 522. The read count and lapsed time begin accumulating again, and the page will be rechecked when another read request for the page is received.

If the error criterion is exceeded, the page is deemed to have suffered some data degradation but can still be fixed. An in-place page-level fix is performed on the page at 516. The page-level fix will attempt to repair the voltage levels of the data that is stored in the page without requiring the page's content to be copied into a new page. This is also referred to as an in-place page-level fix. Unlike a normal SSD refresh operation where the data is copied to another physical location, an in-place page-level fix does not need to erase the cells but makes voltage adjustments to the cells directly, and therefore will not reduce the lifespan of the SSD. More details of the in-place page-level fix are described below in connection with FIGS. 6 and 7.

It is determined at 518 whether the in-place page-level fix is successful. If the in-place page-level fix is successful, the data is considered to be safe from data retention problems again, and the process proceeds to 522, where the read count and the timer are reset. If, however, the in-place page-level fix is unsuccessful, the page data is written to a new physical location and the original page is marked as invalid at 520. Process 500 can be repeated as more pages are read.

Figure 6A:
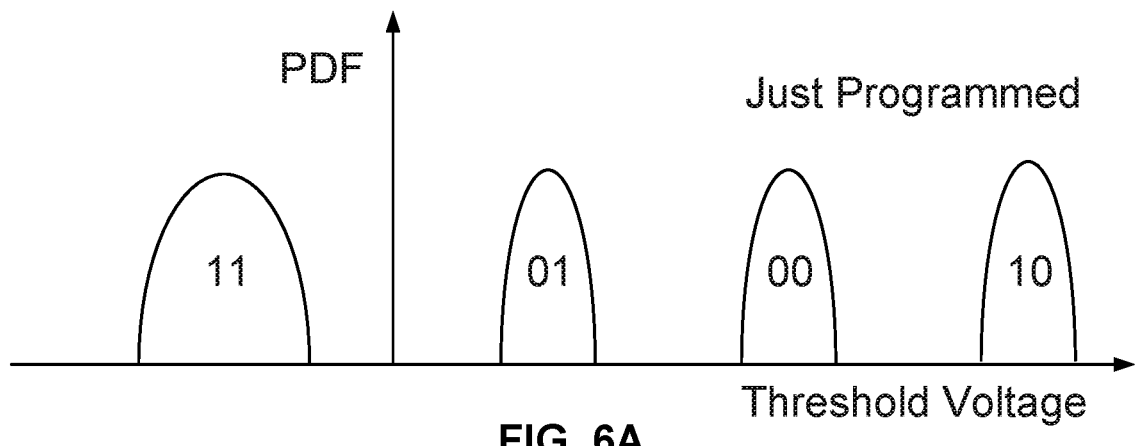
FIGS. 6A-6C illustrate how the threshold voltages are changed by an in-place page-level fix.
Figure 6B:
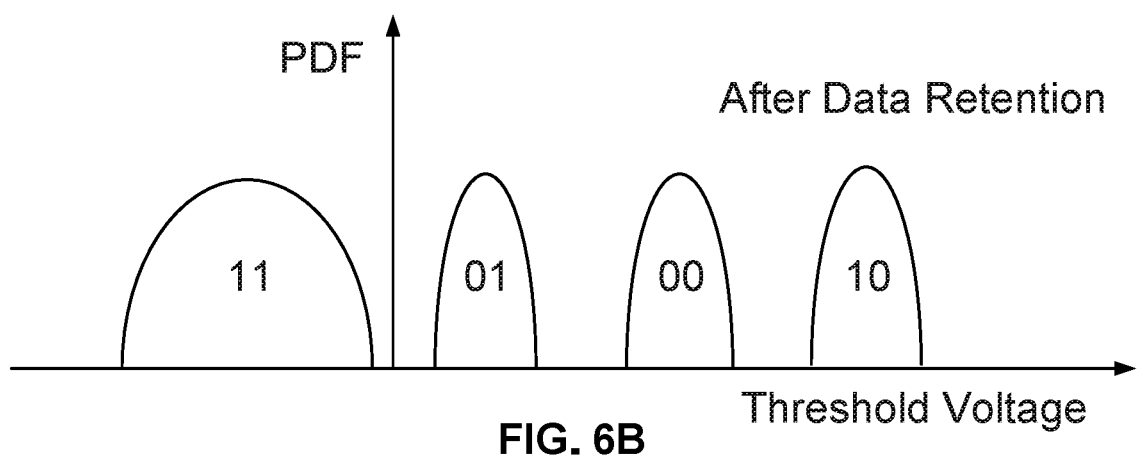
Figure 6C:
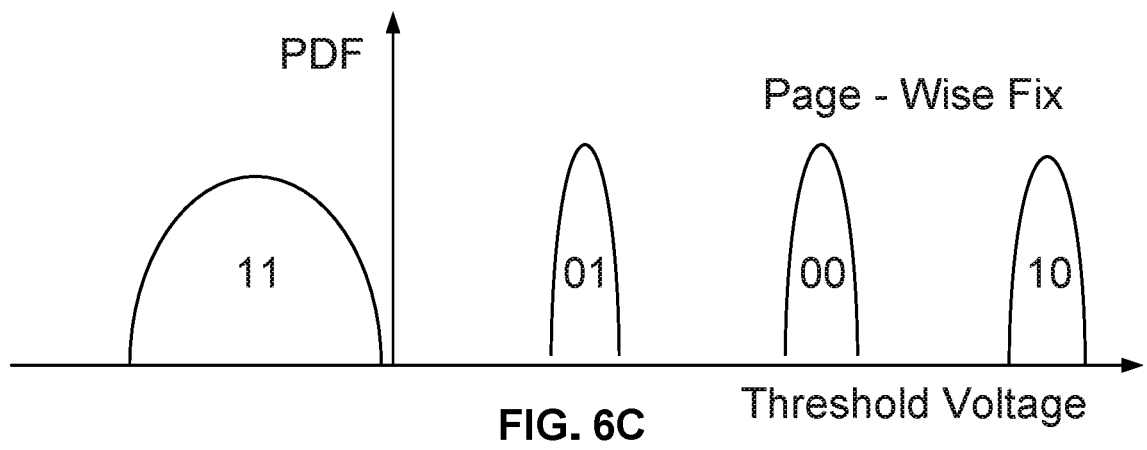

As described in 516 of process 500, an in-place page-level fix is performed. The in-place page-level fix involves performing finer grained quantization to detect the locations of the threshold voltages in the NAND flash cells in the page, and applying charges to the cells to adjust the programmed threshold voltages. FIGS. 6A-6C illustrate how the threshold voltages are changed by an in-place page-level fix. FIG. 6A is a diagram illustrating the distributions of threshold voltages for just programmed data. The X-axis corresponds to the threshold voltage, and the Y-axis corresponds to the probability distribution function. Four threshold voltage levels are used to program two bits of data. After a period of time, the threshold voltages will shift down (to the left) due to charge loss, as shown in FIG. 6B. In FIG. 6C, the in-place page-level fix applies charges to the cells to reshape the distributions of the programmed states and shift the threshold voltage levels up to desired locations that more closely match the threshold voltage distributions shown in FIG. 6A.

Figure 7:
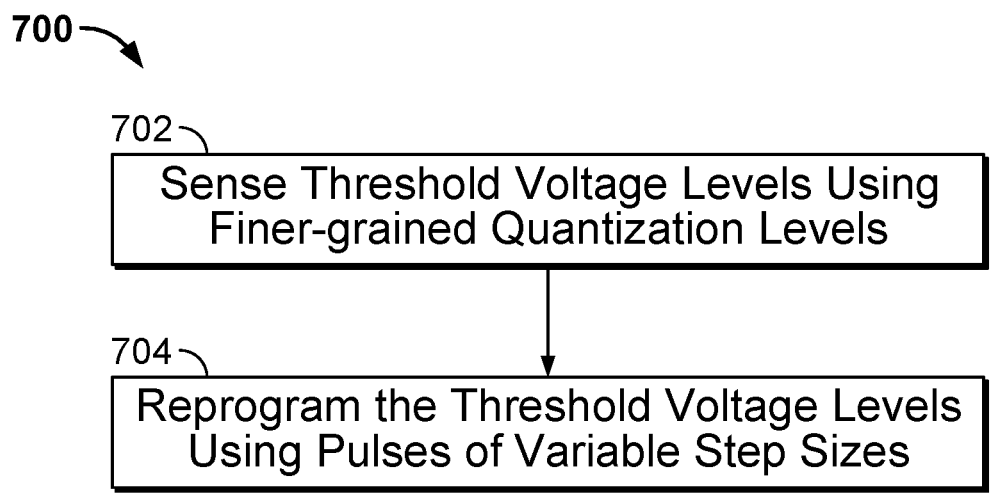
FIG. 7 is a flowchart illustrating an embodiment of a process for performing an in-place page-level fix.

FIG. 7 is a flowchart illustrating an embodiment of a process for performing an in-place page-level fix. Process 700 can be used to implement 516 of process 500.

At 702, the threshold voltage levels of cells on the page are sensed using finer-grained quantization levels than those used in the background read to more precisely locate the stored threshold voltage levels.

At 704, the sensed threshold voltage levels are reprogrammed incrementally by applying electrical pulses of variable step sizes to the cell's floating gate until the reprogrammed threshold voltage levels reach the respective desired levels.

Figure 8:
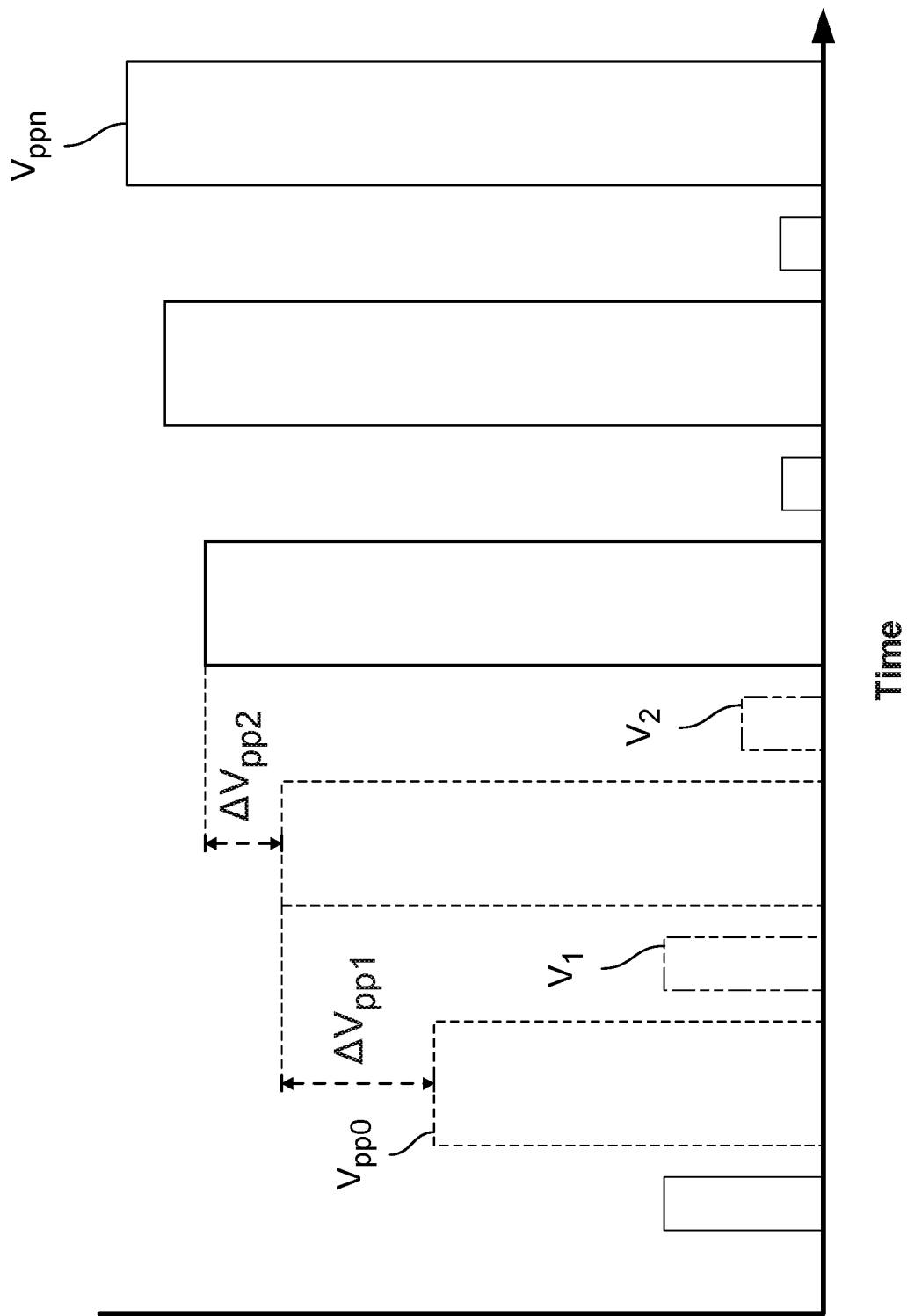
FIG. 8 is a diagram illustrating the incremental variable step size reprogramming for a cell.

FIG. 8 is a diagram illustrating the incremental variable step size reprogramming for a cell. As shown, the initial threshold voltage from the background read is $V_{pp0}$, and the desired voltage level is $V_{ppn}$. A pulse with the incremental step size of $\Delta V_{pp1}$ is applied, and a verification voltage $V_1$ is used to verify that the reprogrammed threshold level is brought to a first range. Another pulse with smaller incremental step size, $\Delta V_{pp2}$, is then applied, and a verification voltage $V_2$ is used to verify that the reprogrammed threshold level is brought to a second range (where the second range is a narrower distribution range within the first range), etc. The size of each $\Delta V_{ppi}$ (i=1, 2, . . . ) can be preset to specific values, as a percentage (e.g., 50%) of $\Delta V_{ppi-1}$, etc. Successive pulses are applied, each having a step size smaller than the previous one and further tightening the threshold voltage distribution, until finally the threshold voltage is in the desired range. Compared with reprogramming using fixed step size (e.g., the same $\Delta V_{pp}$ for all the reprogramming steps), using pulses of variable step sizes allows smaller $\Delta V_{pp}$ to be used, which can make the distribution of the programmed state narrower and also cause less damage to the flash cells' dielectric.

Since the page-wise fix is preventive and helps reduce future read errors, in some embodiments, the page-wise fix is run in the background and/or with a low priority to avoid competing with host I/O requests, thus ensuring quality of service.

Extending the life span and data quality of solid state drives is disclosed. Through the use of workload adaptation and positive write amplification, the data quality and effective lifespan of the devices are improved.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A system, comprising:
a solid state drive (SSD); and
a controller coupled to the SSD, configured to:
determine whether page data included in a page in the SSD has been copied to another storage, including to check a flag associated with the page, the flag indicating whether the page data has been copied to another storage; and
in response to a determination that the page data has not been copied to the other storage:

determine whether page data is to be refreshed, including to check version information associated with the page; and
in response to a determination that the page data is to be refreshed, refresh at least the page data.

2. The system of claim 1, wherein the controller is further configured to perform garbage collection on the page without refreshing the page in response to a determination that the page data has been copied to the other storage.

3. The system of claim 1, wherein to determine whether the page data is to be refreshed includes to:
determine whether the page data is a latest version; and
in response to a determination that the page data is determined to be the latest version:
determine whether a refresh timeout has been reached.

4. The system of claim 3, wherein the controller is further configured to maintain a timestamp associated with the page, and wherein the determination of the refresh timeout is made based at least in part on the timestamp.

5. The system of claim 3, wherein the controller is further configured to refresh a data block in a Not AND (NAND) flash in response to a determination that the refresh timeout has been reached, and the data block being included in the SSD and including the page.

6. The system of claim 3, wherein the controller is further configured to refresh a data block in a Not AND (NAND) flash in response to a determination that the refresh timeout has been reached, the data block being included in the SSD and including the page; and
to refresh the data block in the NAND flash includes to:
copy valid pages in the data block into a free block;
erase the data block; and
place the data block into a pool of free blocks.

7. A system, comprising:
a solid state drive (SSD); and
a controller coupled to the SSD, configured to:
determine whether a number of times a page has been read exceeds a read threshold, or an amount of time since the page was written exceeds a retention threshold, the page being a page of storage included in a solid state drive (SSD);
in response to a determination that the number of times the page has been read is determined to exceed the read threshold, the amount of time since the page was written is determined to exceed the retention threshold, or both, perform a background read of page data associated with the page;
in response to a determination that the page data from the background read exceeds an error threshold, perform an in-place page-level fix of the page;
wherein to perform the in-place page-level fix of the page includes to:
perform finer grained quantization to detect a threshold voltage of a cell in the page; and
reprogram the page to move the threshold voltage of the cell in the page; and
in response to a determination that the in-place page-level fix of the page fails, write the page data to a new physical location in the SSD.

8. The system of claim 7, wherein the controller is further configured to mark the page as invalid in response to a determination that the in-place page-level fix of the page fails.

9. The system of claim 7, wherein the background read of the page data associated with the page includes to obtain raw data and to perform error correcting decoding.

10. The system of claim 7, wherein the controller is further configured to, in response to a determination that the page data from the background read does not exceed the error threshold or in response to a determination that the in-place page-level fix of the page succeeds, reset a read counter configured to track the number of times the page has been read and reset a timer configured to track the amount of time since the page was written.

11. The system of claim 7,
wherein to reprogram the page includes to apply pulses of variable step sizes to the cell to move the threshold voltage to a desired range.

12. The system of claim 7, wherein the in-place page-level fix of the page is run as a background process or as a lower priority process than a host input/output request.

13. A system, comprising:
a solid state drive (SSD); and
a controller coupled to the SSD, configured to:
detect a threshold voltage of a cell in a page of a Not And (NAND) flash in the SSD, the threshold voltage being detected using a finer grained quantization level than what is used in a background read; and
reprogram the page to move the threshold voltage of the cell, including to apply pulses of variable step sizes to the cell.

14. A system, comprising:
a solid state drive (SSD); and
a controller coupled to the SSD, configured to:
determine whether a request sent by a host to a solid state drive (SSD) is associated with a first type of application or a second type of application; and
in response to a determination that the request is associated with the first type of application:
determine whether a page associated with the request includes page data that has been copied to another storage, including to check a flag associated with the page, the flag indicating whether the page data has been copied to another storage; and
in response to a determination that the page is determined not to include page data that has been copied to another storage:
determine whether the page data that has not been copied to the other storage is to be refreshed, including to check version information associated with the page; and
in response to a determination that the page data is determined to be refreshed, refresh at least the page data; and
in response to a determination that the request is associated with a second type of application:
determine whether a number of times the page has been read exceeds a read threshold, or an amount of time since the page was written exceeds a retention threshold; and
in response to a determination that the number of times the page has been read exceeds the read threshold, the amount of time since the page was written exceeds the retention threshold, or both, perform an in-place page-level fix of page data associated with the page.

15. The system of claim 14, wherein the first type of application is write-intensive (WI) application and the second type of application is write once read multiple (WORM) application.

16. A computer program product embodied in a tangible non-transitory computer readable storage medium and comprising computer instructions for:

determining whether page data included in a page in a solid state drive (SSD) has been copied to another storage, including checking a flag associated with the page, the flag indicating whether the page data has been copied to another storage;

in response to a determination that the page data has not been copied to the other storage:

determining whether the page data is to be refreshed, including to check version information associated with the page; and in response to a determination that the page data is to be refreshed, refreshing at least the page data.

17. The computer program product of claim 16, further comprising computer instructions for performing garbage collection on the page without refreshing the page in response to a determination that the page data has been copied to the other storage.

18. The computer program product of claim 16, wherein the determining of whether the page data is to be refreshed includes:

determining whether the page data is a latest version; and in response to a determination that the page data is determined to be the latest version:

determining whether a refresh timeout has been reached.

19. The computer program product of claim 18, further comprising computer instructions for maintaining a timestamp associated with the page, and wherein the determination of the refresh timeout is made based at least in part on the timestamp.

20. The computer program product of claim 18, further comprising computer instructions for refreshing at least the page data includes refreshing a data block in a Not AND (NAND) flash in response to a determination that the refresh timeout has been reached, and wherein the data block is included in the SSD and includes the page.

21. The computer program product of claim 20, wherein the refreshing of the data block in the NAND flash includes:

copying valid pages in the data block into a free block;

erasing the data block; and placing the data block into a pool of free blocks.

22. A computer program product embodied in a tangible computer readable storage medium and comprising computer instructions for:

determining whether a number of times a page has been read exceeds a read threshold, or an amount of time since the page was written exceeds a retention threshold, the page being a page of storage included in a solid state drive (SSD);

in response to a determination that the number of times the page has been read is determined to exceed the read threshold, the amount of time since the page was written is determined to exceed the retention threshold, or both, performing a background read of page data associated with the page;

in response to a determination that the page data from the background read exceeds an error threshold, performing an in-place page-level fix of the page;

wherein performing the in-place page-level fix of the page includes:

performing finer grained quantization to detect a threshold voltage of a cell in the page; and reprogramming the page to move the threshold voltage of the cell in the page; and in response to a determination that the in-place page-level fix of the page fails, writing the page data to a new physical location in the SSD.

23. The computer program product of claim 22, further comprising computer instructions for marking the page as invalid in response to a determination that the in-place page-level fix of the page fails.

24. The computer program product of claim 22, wherein the background read of the page data associated with the page includes obtaining raw data and performing error correcting decoding.

25. The computer program product of claim 22, further comprising computer instructions for, in response to a determination that the page data from the background read does not exceed the error threshold or in response to a determination that the in-place page-level fix of the page succeeds, resetting a read counter configured to track the number of times the page has been read and resetting a timer configured to track the amount of time since the page was written.

26. The computer program product of claim 22, wherein the reprogramming of the page includes applying pulses of variable step sizes to the cell to move the threshold voltage to a desired range.

27. The computer program product of claim 22, wherein the in-place page-level fix of the page is run as a background process or as a lower priority process than a host input/output request.

28. A computer program product embodied in a tangible non-transitory computer readable storage medium and comprising computer instructions for:

detecting a threshold voltage of a cell in a page of a Not And (NAND) flash in a solid state drive (SSD), the threshold voltage being detected using a finer grained quantization level than what is used in a background read; and reprogramming the page to move the threshold voltage of the cell, including by applying pulses of variable step sizes to the cell.

29. A computer program product embodied in a tangible non-transitory computer readable storage medium and comprising computer instructions for:

determining whether a request sent by a host to a solid state drive (SSD) is associated with a first type of application or a second type of application; and in response to a determination that the request is associated with the first type of application:

determining whether a page associated with the request includes page data that has been copied to another storage, including checking a flag associated with the page, the flag indicating whether the page data has been copied to another storage; and in response to a determination that the page is determined not to include page data that has been copied to another storage:

determining whether the page data that has not been copied to the other storage is to be refreshed, including checking version information associated with the page; and in response to a determination that the page data is determined to be refreshed, refreshing at least the page data; and in response to a determination that the request is associated with a second type of application:

determining whether a number of times the page has been read exceeds a read threshold, or an amount of time since the page was written exceeds a retention threshold; and in response to a determination that the number of times the page has been read exceeds the read threshold, the amount of time since the page was written exceeds the retention threshold, or both, performing an in-place page-level fix of page data associated with the page.

30. The computer program product of claim 29, wherein the first type of application is write-intensive (WI) application and the second type of application is write once read multiple (WORM) application.

* * * * *

UNITED STATES PATENT AND TRADEMARK OFFICE
CERTIFICATE OF CORRECTION

PATENT NO. : 10,650,885 B2  
APPLICATION NO. : 15/452263  
DATED : May 12, 2020  
INVENTOR(S) : Shu Li

Page 1 of 1

It is certified that error appears in the above-identified patent and that said Letters Patent is hereby corrected as shown below:

In the Specification

In Column 3, Line 33, delete "PIE" and insert --P/E--, therefor.

Signed and Sealed this  
Twenty-second Day of September, 2020

Andrei Iancu  
*Director of the United States Patent and Trademark Office*